United States Patent
Peterson, Jr. et al.

(10) Patent No.: US 7,567,240 B2
(45) Date of Patent: Jul. 28, 2009

(54) DETECTION OF AND COMPENSATION FOR STRAY CAPACITANCE IN CAPACITIVE TOUCH SENSORS

(75) Inventors: Richard A. Peterson, Jr., Chelmsford, MA (US); Bulent Bulat, Framingham, MA (US); Bruce A. Lessard, Salem, MA (US); Gordon F. Taylor, Bolton, MA (US)

(73) Assignee: 3M Innovative Properties Company, Saint Paul, MN (US)

( * ) Notice: Subject to any disclaimer, the term of this patent is extended or adjusted under 35 U.S.C. 154(b) by 596 days.

(21) Appl. No.: 11/141,228

(22) Filed: May 31, 2005

(65) Prior Publication Data

US 2006/0267953 A1    Nov. 30, 2006

(51) Int. Cl.
*G06F 3/041*    (2006.01)
(52) U.S. Cl. .................. 345/173; 345/156; 178/18.06
(58) Field of Classification Search .............. 345/173, 345/156; 178/18.01, 18.05, 18.06
See application file for complete search history.

(56) References Cited

U.S. PATENT DOCUMENTS

| | | | |
|---|---|---|---|
| 4,293,734 A | 10/1981 | Pepper, Jr. | |
| 4,371,746 A | 2/1983 | Pepper, Jr. | |
| 4,733,222 A | 3/1988 | Evans | |
| 4,806,709 A | 2/1989 | Evans | |
| 5,196,835 A * | 3/1993 | Blue et al. | 345/175 |
| 5,457,289 A | 10/1995 | Huang et al. | |
| 5,902,967 A | 5/1999 | Teterwak | |
| 6,366,277 B1 * | 4/2002 | Armstrong | 345/173 |
| 7,254,775 B2 * | 8/2007 | Geaghan et al. | 715/701 |
| 2003/0206162 A1 | 11/2003 | Roberts | |
| 2004/0178997 A1 | 9/2004 | Gillespie et al. | |
| 2005/0052429 A1 | 3/2005 | Philipp | |

FOREIGN PATENT DOCUMENTS

| | | |
|---|---|---|
| DE | 201 05 640 | 8/2001 |
| EP | 0 589 498 | 3/1994 |
| EP | 0 789 318 | 8/1997 |
| WO | WO 03/049002 | 6/2003 |

\* cited by examiner

*Primary Examiner*—Amare Mengistu
*Assistant Examiner*—Robert R Rainey
(74) *Attorney, Agent, or Firm*—Steven A. Bern

(57) ABSTRACT

The present invention provides systems and methods for detecting stray capacitance in capacitive touch sensors. The existence of stray capacitance can lead to errors in touch detection and touch position determination. Such errors can be avoided or corrected when the stray capacitance is detected. Detecting stray capacitance includes analyzing signals for features characteristic of stray capacitance noise events. Such features can include spatial features such as the location of a test touch position determined from signals caused by stray capacitance, as well as temporal features such as the rate of change of the detected signals.

24 Claims, 3 Drawing Sheets

DETECTION OF AND COMPENSATION FOR STRAY CAPACITANCE IN CAPACITIVE TOUCH SENSORS

The present invention relates to capacitive touch sensors and to detecting and compensating for noise in capacitive touch sensors.

BACKGROUND

Touch input devices can provide a convenient and intuitive way for a user to interact with an electronic system such as a computer, video game, public information kiosk, automotive navigation system, and so forth. Many of these systems include displays positioned behind the touch sensor and in close proximity so that the display is viewed through the touch sensor. The various touch sensing technologies include those known in the art as capacitive, projected capacitive, resistive, surface acoustic wave, and infrared.

SUMMARY

The present invention provides methods of detecting stray capacitance in a touch sensor system that includes a capacitive touch sensor having a resistive layer covering an active area, electronics coupled to a plurality of locations on the resistive layer for determining touch position based on currents flowing through the plurality of locations due to capacitive coupling of a touch implement with the resistive layer. The methods can include comparing a detected signal level to a threshold value, for example a first threshold value that is lower than a threshold for registering a touch down. Another step is determining a test touch position when the threshold value is exceeded, and using the test touch position to determine existence or absence of stray capacitance. Methods of the present invention can additionally or alternatively include detecting a signal on the resistive layer, developing a profile for the signal for a period of time that includes a rise in signal level above the threshold value, determining a rate of change in the signal profile during the rise, and using the rate of change to determine existence or absence of stray capacitance.

The present invention also provides capacitive touch screen systems that include a capacitive touch sensor incorporating a resistive layer, and electronics coupled to the resistive layer at a plurality of locations on the resistive layer for detecting signals caused by capacitive couplings to the resistive layer, the electronics configured to determine a location of a touch implement capacitively coupled to the resistive layer based on currents flowing through the plurality of locations due to the capacitive coupling. The electronics are further configured to distinguish signals caused by coupling of stray capacitances to the resistive layer from signals caused by coupling of touch implements to the resistive layer based on analyzing the signals against one or more features characteristic of stray capacitances.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
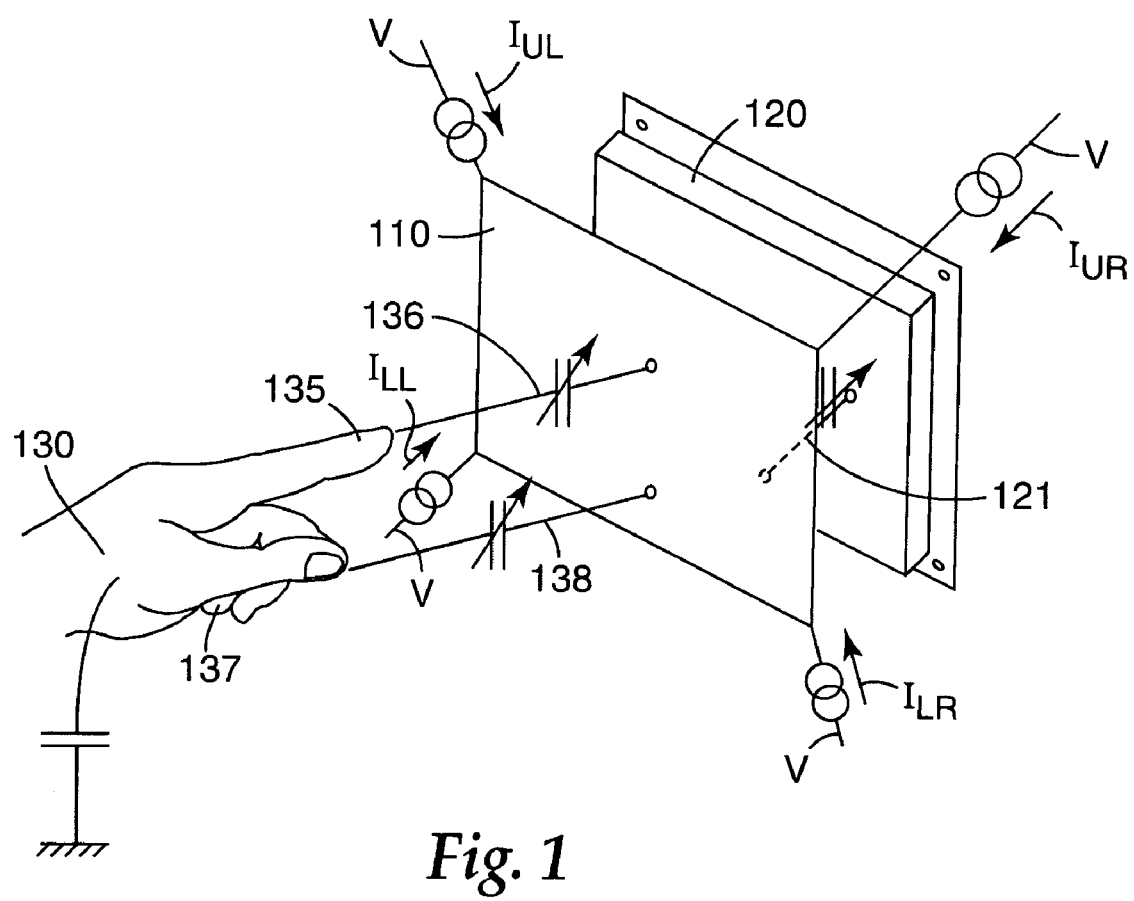
FIG. 1 is a schematic exploded view of a capacitive touch screen display.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

The present invention relates to detecting stray capacitances in capacitive touch input systems, particularly in systems incorporating a capacitive touch sensor that lacks a shielding layer that would otherwise shield the active touch layer from some stray capacitances. The present invention can use any combination of techniques for distinguishing signals due to stray capacitance from signals due to touch inputs or impending touch inputs, including spatial techniques whereby a triangulated position is calculated from pre-touch signals and compared to positional indications expected from stray capacitances, temporal techniques whereby the rate of change of signal is compared against behavior expected from stray capacitance signals, and the like. Any of these techniques can use static or dynamic signal thresholds as triggering events, and the spatial or temporal criteria can be predetermined as well as learned or further refined over time as the system experiences and records various stray capacitance events.

Unaccounted for, stray capacitances can lead to positional errors in reported touch input positions, or even to the non-reporting of a valid touch input. Stray capacitances often produce signals that when triangulated result in a "phantom" point that is localized in a predictable area of the touch sensor. Stray capacitances also often give rise to a very rapidly increasing signal without being preceded by the gradual signal increase often detected ahead of a valid touch input and without subsequently exceeding the touch threshold. In the present invention, observations of test touch points localized in particular areas on the touch sensor and/or observations of rapidly rising signals directly off a relatively flat baseline can be used along with various signal thresholds to detect, and in some cases to compensate for, stray capacitances.

In typical operation, the electronics of a capacitive touch sensor can monitor the background signal to develop and update a signal baseline. When a touch input occurs, the resulting signals are referenced to the baseline. The existence of stray capacitances increase the overall signal level. If the stray signals are updated into the baseline for too long while a touch is approaching the sensor, the touch thresholds are commensurately raised, thus reducing sensitivity to touch inputs. As a result, there is a signal level at which baseline updates of stray signals are preferably suspended. If baseline updates of stray capacitance signals are suspended prematurely, however, positional errors can occur because the stray signals are folded into the touch input signal. The positional error is generally in the form of a small perturbation from the true touch location toward the phantom point caused by the stray signals.

In some capacitive touch sensor systems a threshold is defined above which the normal baseline updating is suspended. Exceeding this threshold will generally place the system into so-called "hover mode." The influence of stray capacitance can incorrectly cause the electronics of a capacitive touch sensor to go into a hover mode, hindering touch input detection. This can lead to the undesirable effect of not reporting valid touch inputs or incorrectly reporting touch input position. Systems and methods of the present invention can recognize stray capacitances and bypass normal responses, allowing touch inputs to be desirably detected and accurately reported even in the presence of stray capacitance events.

In noisy environments, the noise itself may trigger the hover threshold, incorrectly suspending stray updates in anticipation of a touch. This is particularly probable in capacitive touch sensor systems that lack a rear shielding layer. Rear shields are transparent conductive layers or grids disposed on the rear surface of the touch screen, which is the surface facing the underlying display device. The rear shield serves to shield the touch screen from capacitive coupling to the display and other stray capacitances. In the absence of such a shield, sudden changes in stray capacitances may falsely cause suspension of the stray capacitance updates for extended periods of time. Even in systems with a rear shield, stray capacitances can occur that cause similar effects, for example a moving bezel in front of the touch sensor.

In systems and methods of the present invention, a tracking algorithm can be used to segregate real touch signals from stray capacitance signals by detecting, applying, or comparing rates of change of signals, signal thresholds, occurrences of timeouts, noise filtration, noise analysis and so forth. Such analyses can take place using time domain signals, for example by analyzing the rate of change of signals to determine whether the signal profile is indicative of a change induced by stray capacitance, noise, or an approaching touch. The spatial domain can also be used, for example by applying fuzzy logic to evaluate how much a calculated "test touch" location deviates from a limited and well-defined area, whether predetermined or developed over time, such as the physical center of the touch screen. Spatial domain analysis can take advantage of expected or observed behavior of signals induced by stray capacitance.

FIG. 1 schematically shows a capacitive touch sensor 110 disposed in front of a display panel 120 such as a liquid crystal display (LCD). The capacitive touch sensor 110 includes a resistive layer covering an active touch area. The four corners of the resistive layer (designated as UL, UR, LL and LR by convention) are excited with a small AC voltage from the controller electronics, indicated by a voltage V applied at each corner in FIG. 1. When a grounded conductive touch implement such as a finger 135 of a user's hand 130 comes into sufficient proximity of the resistive layer of the touch sensor 110, the finger 135 and the touch sensor 110 are coupled through capacitance 136. Due to this coupling, current flows through each of the corners of the resistive layer as indicated in FIG. 1 by the currents $I_{UL}$, $I_{UR}$, $I_{LL}$ and $I_{LR}$ flowing through each corner into the resistive layer to touch point P. The location of touch point P is determined using the relative ratios of the currents above the developed baseline, thereby taking into account noise and slow variation, and is based on the principle that more current passes through a corner that is nearer to the touch. There may also exist a capacitive coupling 138 due a contribution from the rest of the user's hand 137 that somewhat perturbs the position location of the finger touch, which can be subtracted to achieve a more accurate touch position determination.

The currents flowing through the resistive layer in response to a touch input can be small relative to the currents that flow through the resistive layer due to stray capacitances coupled between the touch screen and miscellaneous items in close proximity. Items that can cause stray capacitances include the display (for example the capacitive coupling 121 between display 120 and touch sensor 110 in FIG. 1), the bezel (not shown) that surrounds the touch screen display, parts of a user other than the touch implement (for example, the user's body, head, other hand, etc.), other people, various circuit capacitances originating in and around the touch screen display system, and so forth.

Capacitive touch sensor stability and positional accuracy can be achieved in part by means of detecting and compensating for changes in stray capacitances. The touch sensor controller electronics can be used to differentiate from among various sources of changes in the corner currents by comparing the instantaneous currents against a baseline signal developed over a relatively long period of time. When detected currents change slowly, the changes in instantaneous values are treated as environmental effects and filtered over time into the baseline. When detected currents change quickly, they are interpreted as changes due to an approaching touch or an actual touch contact, termed a "touch down." In the case of sufficiently rapidly changing currents, stray capacitance updates are suspended in favor of detecting and recording an impending and anticipated valid touch, and the baseline updates are generally not renewed until some set period of time after the touch input is disengaged, termed a "lift off." This behavior can be problematic in situations where stray capacitances trigger suspension of the baseline updates in anticipation of recording a touch down that in actuality is not impending.

The algorithm performed by the controller electronics makes certain decisions based on whether the aggregate of the corner currents exceed predetermined thresholds within a duration shorter than the stray capacitance filtering time constant (typically in the range of 1 to 60 seconds). Several thresholds may be predefined, namely: (i) a slowly changing stray capacitance baseline used as the zero signal reference; (ii) a touch threshold that, when exceeded, signals a touch down event that triggers detection and reporting of a touch position and streaming of touch position data; (iii) a lift off threshold set at some level below the touch threshold, for example about 90% of the touch threshold, so that when the signal drops below the lift off threshold after previously exceeding the touch threshold, a lift off event is reported and touch position data streaming stops; (iv) a hover threshold set at some level below the touch threshold and the lift off threshold, for example approximately 25% of the touch threshold, below which stray capacitances are updated into the baseline by a slow low pass filter and above which slow stray capacitance updates are suspended in favor of enabling a fast temporary stray capacitance update; and (v) a fast stray threshold set at some level between the hover threshold and the touch threshold, for example approximately 75% of the touch threshold, above which all baseline updates are suspended. As a result of these threshold definitions, when the signal drops below the fast stray threshold (for example after a lift off), fast stray updates are resumed, and when the signal drops below the hover threshold, fast stray updates continue and the slow stray updates are not resumed until a touch has been absent for a predetermined period.

Figure 2A:
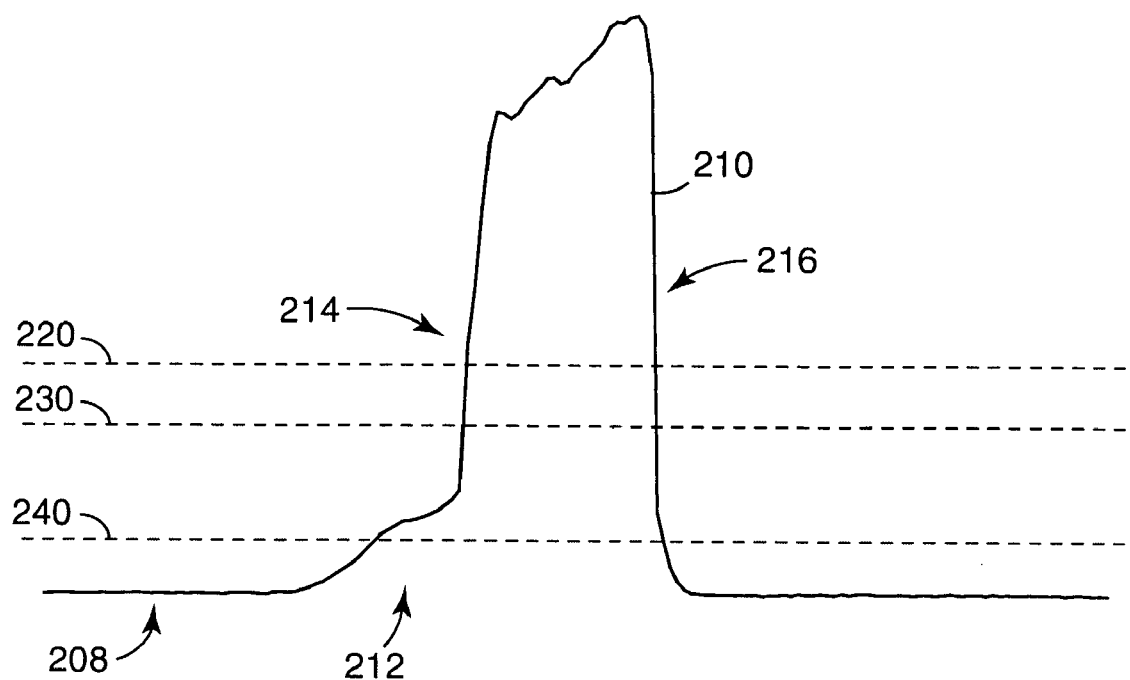
FIG. 2(a) is an exemplary time domain plot of total signal detected by a capacitive touch sensor during the time that a touch input occurs near the upper left corner of the touch sensor.

FIG. 2(a) shows a total signal profile 210 for signals detected by a capacitive touch sensor over a period of time that includes a valid touch input event. The signal profile 210 represents the sum of the currents flowing through each of the corners of the touch sensor. Profile 210 includes several characteristic features, including a baseline 208, a gradually rising region 212 that indicates an approaching touch object, a rapidly rising region 214 that indicates touch down of the touch object on the sensor surface, and a rapidly decreasing region 216 that indicates a touch lift off. Various threshold levels referenced to the baseline 208 are also indicated, including the slow stray update, or hover, threshold 240, the fast stray update threshold 230, and the touch threshold 220. Once the total signal exceeds the touch threshold 220, touch position data is calculated.

Figure 2B:
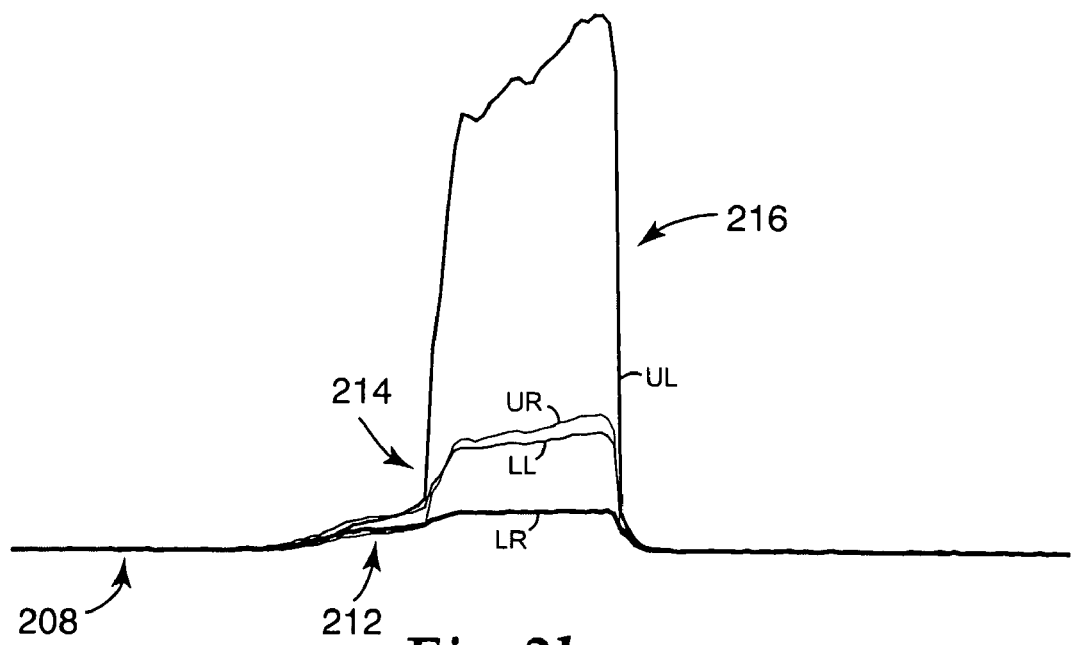
FIG. 2(b) is a time domain plot for the same signal shown of FIG. 2(a) that separates the signal contribution from each of the corner currents.

FIG. 2(b) shows the individual contributions of the currents flowing through each of the corners UL, UR, LL and LR for the total signal shown in FIG. 2(a). The touch input occurred near the upper left corner of the touch sensor, resulting in the highest contribution from corner UL, the lowest contribution from corner LR, and contributions from corners UR and LL between them. While the overall profile for each corner current is somewhat similar in shape, the exact characteristics of the changes, including the relative magnitudes, are very different. Touch position is calculated using the difference between the detected current at each corner and the baseline current level.

Figure 3A:
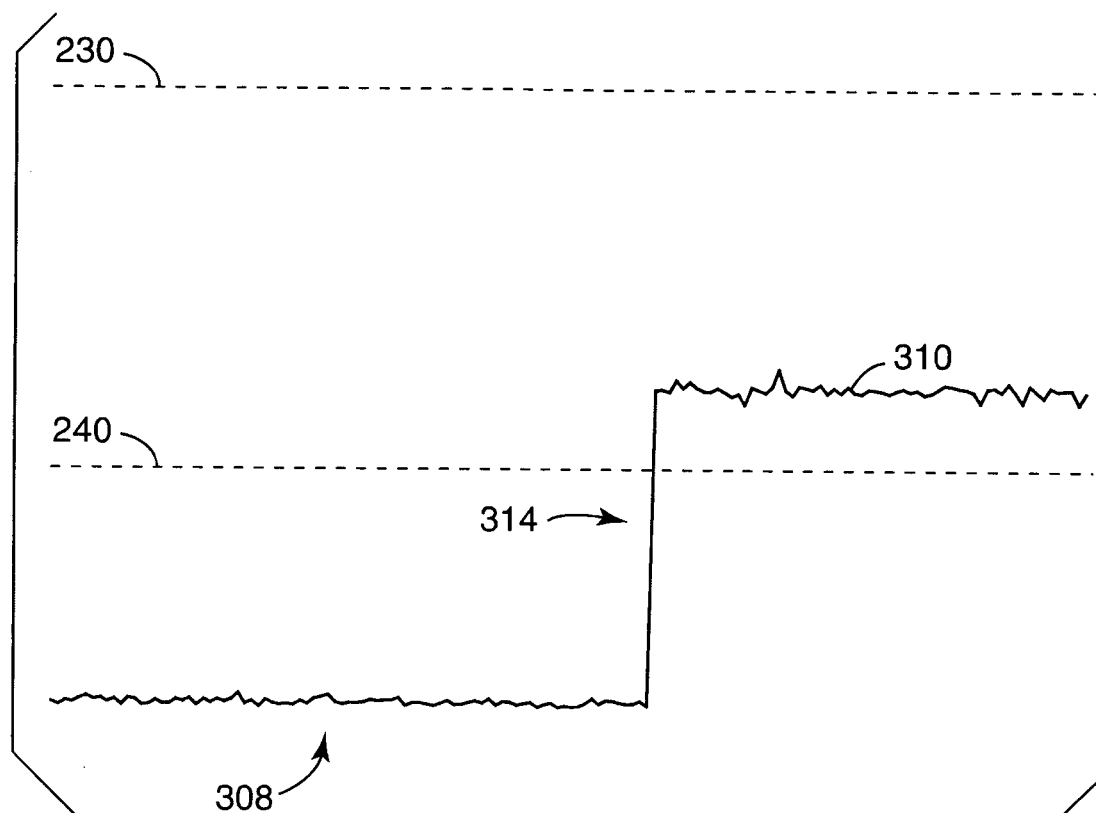
FIG. 3(a) is an exemplary time domain plot of total signal detected by a capacitive touch sensor during the time that a stray capacitance is coupled into the touch sensor.

FIG. 3(a) shows a total signal profile 310 for signals detected by the same capacitive touch sensor indicated in FIGS. 2(a) and 2(b) over a period of time that includes a stray capacitance event caused by turning on an LCD positioned behind the touch sensor. Profile 310 includes characteristic features such as a baseline 308 and nearly instantaneous rise 314 that occurs when the LCD is turned on. The hover threshold level 240 and fast stray update threshold 230 level are also indicated. A comparison of profile 310 against profile 210 reveals that the signal rise due to the stray capacitance is faster than for a touch input event, that the rapid signal rise due to the stray capacitance occurs directly from the baseline and is not preceded by the gradual rise that occurs ahead of a touch down, and that the stray capacitance can establish a signal level exceeding the hover threshold even though it is well below the touch threshold.

Figure 3B:
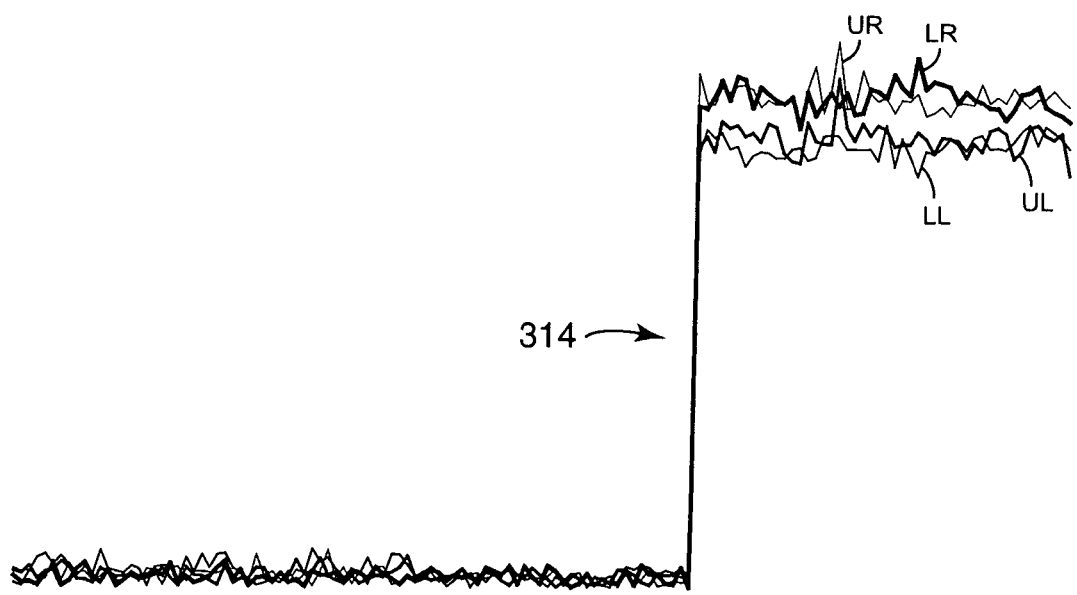
FIG. 3(b) is a time domain plot for the same signal shown of FIG. 3(a) that separates the signal contribution from each of the corner currents.

FIG. 3(b) shows the individual contributions of the currents flowing through each of the corners UL, UR, LL and LR for the total signal shown in FIG. 3(a). Because stray capacitance due to powering up a proximate LCD tends to affect each corner current nearly equally, the signal contribution from each corner is about the same. As a result, the profiles, magnitudes, and characteristic features of the signals for each of the corners indicate very little or no difference, and any test touch position calculated after the rapid rise 314 would be located at or near the center of the touch screen.

Environmental changes that can cause stray capacitances include ambient temperature fluctuations, which may be further disturbed by turning on or off a display that is in close proximity with the touch screen. Furthermore, LCDs often have driven front layers carrying AC voltages as well as exhibiting a variable effective impedance to ground. The present inventors have observed that the stray capacitance effects such as thermal fluctuations and LCD related variations are averaged over the whole touch screen, therefore affecting the four corner currents of the touch sensor approximately equally. Touch sensor non-linearities, screen distortions, touch sensor integration offset from the display center, bias in the display electronics, and so forth may lead to some inequalities in how each of the corner currents is affected by strays, but such offsets should be determinable through calibration routines or measurement histories, even if such offsets drift over time. Other stray capacitances may give rise to signals that indicate localization around other points of the touch screen other than the center, which points should likewise be predictable or otherwise determinable.

As such, the signals caused by strays can be analogized to signals that are caused by a touch implement approaching the center of the touch screen (or other area localized around a point). This observation in and of itself can be helpful in distinguishing real touch signals from signals caused by strays. For example, when the hover threshold is exceeded, the existing signals can be used to triangulate a test touch location. If the test touch location is not at or sufficiently near the center of the screen (or other determined point), it is highly likely that the signals are not due to the display, thermal variations, or other stray capacitances, indicating that stray updates can be suspending in anticipation of a valid touch input. A test touch location at or sufficiently near the center of the screen (or other determined point) may indicate a stray capacitance, thus allowing the suspension of stray updates to be disabled. What constitutes "sufficiently near" can be based on observed or expected behavior or can be based on a system "sweet spot" that takes into account factors such as screen size (e.g., in larger touch screens what constitutes sufficiently near may be larger in gross distance even if smaller as a percentage of the screen size). The determined area indicative of stray capacitance can be preset, developed over time and/or determined by calibration routines, and can be static or updatable. In addition, the system can keep a log of stray capacitance events in memory, thereby developing a history based on which new localized touch screen areas can be designated as likely positional identifiers of stray capacitances. Using signal histories in this way can also result in new positional indicators for stray capacitances that were not known or anticipated at the time of manufacture or installation.

Signals due to stray capacitances such as environmental influences can be successfully segregated from signals due to touch influences based on the location of the test touch position. For example, detected signal changes can be categorized as "common mode" changes or "differential mode" changes. Common mode changes correspond to effects that are geometrically centered on a defined point of the touch screen such as the touch screen center, thereby indicating stray capacitance influences. Differential mode changes correspond to effects that are sufficiently distinguished from the defined point, for example away from the touch screen center, thereby indicating valid touch influences. Common mode signal changes will be consistent from event to event, and often consistent among the signals detected at each of the corners for the same event, for example as seen in FIG. 3(b). Differential mode signal changes will differ from event to event, and differ among the signals detected at each of the corners for the same event, for example as seen in FIG. 2(b).

In one implementation of the present invention, different filter time constants can be applied to the common and differential modes, for example using a faster filter for common mode signals than for differential mode signals in order to compensate for expected reduced sensitivity to valid touch signals in the face of stray capacitance effects. In another implementation, stray capacitances can be monitored so that when the signal exceeds a predetermined adaptive threshold, different from the touch threshold and taking into account the stray capacitance influence, a touch input location is calculated. Depending on whether the indicated location is near the center of the screen (or other defined point), the algorithm can decide whether the signals should be treated as a slow drift (thus updated into the baseline) or as a touch-related short term disturbances (thus suspending baseline updates).

In an exemplary embodiment, a function can be added to the touch detection algorithm that disables the suspension of stray updates when the total signal is above the hover threshold and the calculated test touch location corresponds to a position within +/−5% of the geometric center of a 15 diagonal inch touch screen, the +/−5% taken in both the x-direction (horizontal across screen) and y-direction (vertical across screen). This area, which corresponds to the central 1% of the total area of the touch screen, is sufficient to capture typical stray capacitances caused by the environment or the display while preserving the ability to detect and report valid touch inputs (which are unlikely to be located in the central 1% of the screen). This area should also be sufficient to take into account small variances from screen to screen such as alignment variances between the touch sensor and the display that may occur during integration. Disabling the suspension of stray updates allows the stray capacitance signal to be updated into the baseline, and allows touch down events to be detected. The same +/−5% (or other desirable amount) can be applied to other points on the touch screen that have been identified as indicative of strays. In exemplary embodiments, the system's firmware can be preset to disable suspension of stray updates when the test touch position is within a determined distance of predetermined point(s) on the touch screen, and an accumulated history of stray capacitance events can be used to, for example, shift the predetermined point(s) to the statistical center of a cluster of stray capacitance positions, reduce the size of the area around the determined points, or define new points indicative of strays.

The present invention need not interfere with techniques that are commonly employed to distinguish other types of noise or unintended touch signals. For example, it is common for the users of a touch screen display to place a hand on the side of the display, which can cause a change in the stray capacitance signals. The strays introduced by such an event generally affect one corner or one side of the touch screen significantly more than the other(s). The triangulated equivalent "touch" point is therefore off-center and easily differentiated from common mode noise sources.

A decision about whether to suspend the updating of baseline strays can also be made based on the rates of change of the observed signals. As a touch object approaches a capacitive touch sensor, the signals change due to coupling of the sensor to the hand, arm, finger, etc. The rate of change increases as the touch object makes contact with the sensor, as can be seen in FIG. 2(a). The differing rates of change can be used to differentiate valid touch events from strays. A signal change that occurs abruptly without being preceded by a signal change that is less abrupt and/or that occurs abruptly without exceeding the touch threshold can be indicative of a noise event distinguishable from a touch. Systems and methods of the present invention can allow stray tracking to continue when such signal profiles are detected. This technique can be used on its own or as a qualifier for spatial techniques such as the "sufficiently near center" method. As a qualifier, signal rate of change methods can be used to detect and compensate for stray capacitances occurring during an impending touch that is hovering near the center of the sensor (or other region that has been identified to be indicative of stray events).

In any implementation of the present invention, dynamic, or adaptive, thresholding can be used to compensate for stray capacitance and to avoid undesirably going into hover mode in the presence of noise. Dynamic thresholding involves adjusting one or more of the defined thresholds, such as the hover threshold, based on an analysis of the detected noise envelope. Noise riding on the touch sensor signals produce instantaneous offsets that are generally handled by signal filtering. However, if the noise level is large enough, it may exceed the hover threshold, resulting in the suspension of baseline updates. In such cases, the present invention can be used to detect the noise, and based on an analysis of the noise magnitude the hover threshold can be raised by an amount proportional to the noise level. Any of the other thresholds can similarly be adjusted using such analysis.

When using test touch position as an indication of stray capacitance, the scenario in which a valid touch input occurs within the area designated as indicative of strays should be recognized. In general, methods and systems of the present invention will not interfere with the registration of a valid touch in the area designated as indicative of stray capacitance signals. However, in methods where slow stray updates are suspended, the position of a valid touch input in the designated area may be reported with some inaccuracies. In the special case where the central portion of the touch screen is the designated area, the stray capacitance signal tends to offset valid signals toward the center of the touch screen, and as such a valid touch in the center should not be adversely affected. In cases where the designated area is away from the center of the touch screen, the signal that existed prior to confirmation of a valid touch may be subtracted, much like a baseline, to remove the influence of the stray capacitance and give a sufficiently accurate touch position.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of detecting stray capacitance in a touch sensor system that includes a capacitive touch sensor having a resistive layer covering an active area, electronics coupled to a plurality of locations on the resistive layer for determining touch position based on currents flowing through the plurality of locations due to capacitive coupling of a touch implement with the resistive layer, the method comprising:
   determining a test touch position when a level of a detected signal exceeds a threshold value above a baseline signal level generated from a detected signal;
   in response to the step of determining, using the test touch position to determine whether the detected signal is due to an impending touch input or stray capacitance; and
   in response to the step of using the test touch position, controlling updates to the baseline signal level.

2. The method of claim 1, further comprising suspending updates to a baseline signal level when it is determined that the detected signal is due to an impending touch input and disabling suspension of updates to the baseline signal level when it is determined that the detected signal is due to stray capacitance.

3. The method of claim 1, further comprising
   developing a baseline signal level for the touch sensor system over a first period of time
   developing a profile for the detected signal over a second period of time;

determining a rate of change in the level of the detected signal;

using the rate of change to determine whether the detected signal is due to an impending touch input;

using the rate of change to determine whether the detected signal is due to a stray capacitance updating the baseline signal level based on the level of the detected signal when it is determined that the detected signal is due to stray capacitance; and independently tracking signals determined to be due to stray capacitance.

4. The method of claim 3, wherein the signals due to stray capacitance are used to correct the baseline signal level.

5. The method of claim 3, wherein the signals due to stray capacitance are used to adjust one or more signal thresholds.

6. The method of claim 1, further comprising using a first time constant to filter signals determined to be due to an impending touch input and using a second time constant different from the first to filter signals determined to be due to stray capacitance, wherein stray capacitance is not caused by a touch input.

7. The method of claim 6, wherein the first time constant is longer than the second time constant.

8. The method of claim 1, wherein a test touch position within a determined distance from a defined point on the capacitive touch sensor indicates that the detected signal is due to stray capacitance, and wherein stray capacitance is not caused by a touch input.

9. The method of claim 8, wherein the determined distance is preset.

10. The method of claim 8, wherein the determined distance is based on criteria including touch sensor size.

11. The method of claim 8, wherein the determined distance is within +/−5% of the defined point based on the touch sensor size in the direction of the determined distance.

12. The method of claim 8, wherein the determined distance is refined based on a recorded history of stray capacitance events.

13. The method of claim 8, wherein the defined point is the center of the touch sensor.

14. The method of claim 8, wherein the defined point is preset.

15. The method of claim 8, wherein the defined point is developed from a recorded history of stray capacitance events.

16. The method of claim 1, wherein the threshold value is lower than a touch threshold, and wherein the detected signal is determining to be due to stray capacitance if the level of the detected signal does not subsequently exceed the touch threshold.

17. The method of claim 16, wherein the touch threshold is dynamically adjusted based on whether the detected signal is determined to be due to an impending touch input or stray capacitance.

18. The method of claim 1, further comprising using a rate of change of the level of the detected signal to determine whether the detected signal is due to an impending touch input or stray capacitance.

19. A method of detecting stray capacitance in a touch sensor system that includes a capacitive touch sensor having a resistive layer covering an active area, electronics coupled to a plurality of locations on the resistive layer for determining touch position based on currents flowing through the plurality of locations due to capacitive coupling of a touch implement with the resistive layer, the method comprising:

detecting a signal on the resistive layer;

developing a profile for the signal for a period of time that includes a rise in signal level above a threshold relative to a baseline signal level generated from the detected signal;

determining a rate of change in the signal profile during the rise and a test touch position;

in response to the step of determining, using the rate of change and the test touch position to determine whether the detected signal is due to an impending touch input or due to stray capacitance; and in response to the step of using the rate of change and the test touch position, controlling updates to the baseline signal level.

20. The method of claim 19, wherein when the rate of change exceeds a predetermined value, the detected signal is due to stray capacitance.

21. A capacitive touch screen system comprising:

a capacitive touch sensor comprising a resistive layer; and electronics coupled to the resistive layer at a plurality of locations on the resistive layer for detecting signals caused by capacitive couplings to the resistive layer, the electronics configured to determine a location of a touch implement capacitively coupled to the resistive layer based on currents flowing through the plurality of locations due to the capacitive coupling, and where the electronics are further configured to distinguish signals caused by coupling of stray capacitances to the resistive layer from signals caused by coupling of an impending touch input to the resistive layer based on analyzing the signals against one or more features characteristic of stray capacitances, including detection of a level of a detected signal being greater than a threshold value that is defined relative to a baseline signal level generated from a detected signal and a related detection of a test touch position; and in response to the analysis, controlling updates to the baseline signal level.

22. The touch sensor system of claim 21, further comprising an electronic display disposed in close proximity to the capacitive touch sensor and viewable therethrough.

23. The touch sensor system of claim 21, wherein the one or more feature characteristic of stray capacitances include proximity of a test touch position to a determined location indicative of stray capacitances, the test touch position calculated when the signals exceed a threshold value.

24. The touch sensor system of claim 21, wherein the one or more feature characteristic of stray capacitances include a rate of change of the signals when the signals exceed a threshold value.

* * * * *

UNITED STATES PATENT AND TRADEMARK OFFICE
CERTIFICATE OF CORRECTION

PATENT NO. : 7,567,240 B2  Page 1 of 1
APPLICATION NO. : 11/141228
DATED : July 28, 2009
INVENTOR(S) : Richard A. Peterson, Jr.

It is certified that error appears in the above-identified patent and that said Letters Patent is hereby corrected as shown below:

Column 8
Line 65, delete "time" and insert -- time; -- therefor.

Column 9
Claim 16, Line 48, delete "determining" and insert -- determined -- therefor.

Signed and Sealed this

Twenty-fourth Day of November, 2009

David J. Kappos
*Director of the United States Patent and Trademark Office*